(12) United States Patent
Kwon

(10) Patent No.: US 11,929,122 B2
(45) Date of Patent: Mar. 12, 2024

(54) APPARATUS AND METHOD FOR ERASING DATA IN A NON-VOLATILE MEMORY DEVICE

(71) Applicant: SK hynix Inc., Gyeonggi-do (KR)

(72) Inventor: Tae Heui Kwon, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 132 days.

(21) Appl. No.: 17/671,002

(22) Filed: Feb. 14, 2022

(65) Prior Publication Data

US 2023/0017178 A1 Jan. 19, 2023

(30) Foreign Application Priority Data

Jul. 16, 2021 (KR) .................. 10-2021-0093236

(51) Int. Cl.
| | | |
|---|---|---|
| *G11C 16/14* | (2006.01) | |
| *G11C 16/24* | (2006.01) | |
| *G11C 16/26* | (2006.01) | |
| *G11C 16/30* | (2006.01) | |
| *G11C 16/32* | (2006.01) | |
| *G11C 16/34* | (2006.01) | |

(52) U.S. Cl.
CPC .............. *G11C 16/14* (2013.01); *G11C 16/24* (2013.01); *G11C 16/26* (2013.01); *G11C 16/30* (2013.01); *G11C 16/32* (2013.01); *G11C 16/3445* (2013.01)

(58) Field of Classification Search
CPC ......... G11C 16/14; G11C 16/24; G11C 16/26; G11C 16/30; G11C 16/32; G11C 16/3445; G11C 16/0483; G11C 16/16; G11C 16/08
USPC ..................................................... 365/185.29
See application file for complete search history.

(56) References Cited

U.S. PATENT DOCUMENTS

| | | | |
|---|---|---|---|
| 7,372,754 B2 | 5/2008 | Hwang et al. | |
| 9,396,803 B2 | 7/2016 | Arakawa | |
| 2020/0143893 A1* | 5/2020 | Rabkin | G11C 16/3445 |
| 2020/0257473 A1 | 8/2020 | Kim et al. | |
| 2020/0286565 A1 | 9/2020 | Bayle | |
| 2022/0375528 A1* | 11/2022 | Sakui | G11C 16/16 |

FOREIGN PATENT DOCUMENTS

| | | | | |
|---|---|---|---|---|
| CN | 101490837 A | * | 7/2009 | ......... G11C 16/0416 |
| KR | 20100013954 A | * | 2/2010 | ............. G11C 29/50 |

* cited by examiner

*Primary Examiner* — Fernando Hidalgo
(74) *Attorney, Agent, or Firm* — IP & T GROUP LLP

(57) ABSTRACT

A memory device includes plural non-volatile memory cells and a control circuit. The plural non-volatile memory cells can store data and are arranged in series between a bit line and a source line. The control circuit synchronizes discharge of charges, which are accumulated in a channel formed by the plural non-volatile memory cells, through the bit line and the source line during an erase operation for erasing the data stored in the plural non-volatile memory cells.

18 Claims, 10 Drawing Sheets

APPARATUS AND METHOD FOR ERASING DATA IN A NON-VOLATILE MEMORY DEVICE

CROSS-REFERENCE TO RELATED APPLICATIONS

This patent application claims the benefit of Korean Patent Application No. 10-2021-0093236, filed on Jul. 16, 2021, the entire disclosure of which is incorporated herein by reference.

TECHNICAL FIELD

One or more embodiments described herein relate to a memory device, and more particularly, to an apparatus and method for erasing data stored in a non-volatile memory device.

BACKGROUND

Recently, a paradigm for a computing environment has shifted to ubiquitous computing, which enables computer systems to be accessed virtually anytime and anywhere. As a result, the use of portable electronic devices (e.g., mobile phones, digital cameras, notebook computers, or the like) is rapidly increasing. Each of these devices may use or include a memory system having at least one memory device. The memory system may be a data storage device, which, for example, may be used as a main storage device or an auxiliary storage device.

Such a data storage device may include one or more non-volatile semiconductor memories that exhibit improved stability and durability, have no mechanical driving parts (e.g., a mechanical arm), and thus provide high data access speeds and relatively low power consumption. Examples of these types of data storage devices include, but are not limited to, Universal Serial Bus (USB) memory devices, memory cards having various interfaces, and solid state drives (SSDs).

BRIEF DESCRIPTION OF THE DRAWINGS

The description herein makes reference to the accompanying drawings wherein like reference numerals refer to like parts throughout the figures.

DETAILED DESCRIPTION

Figure 1:
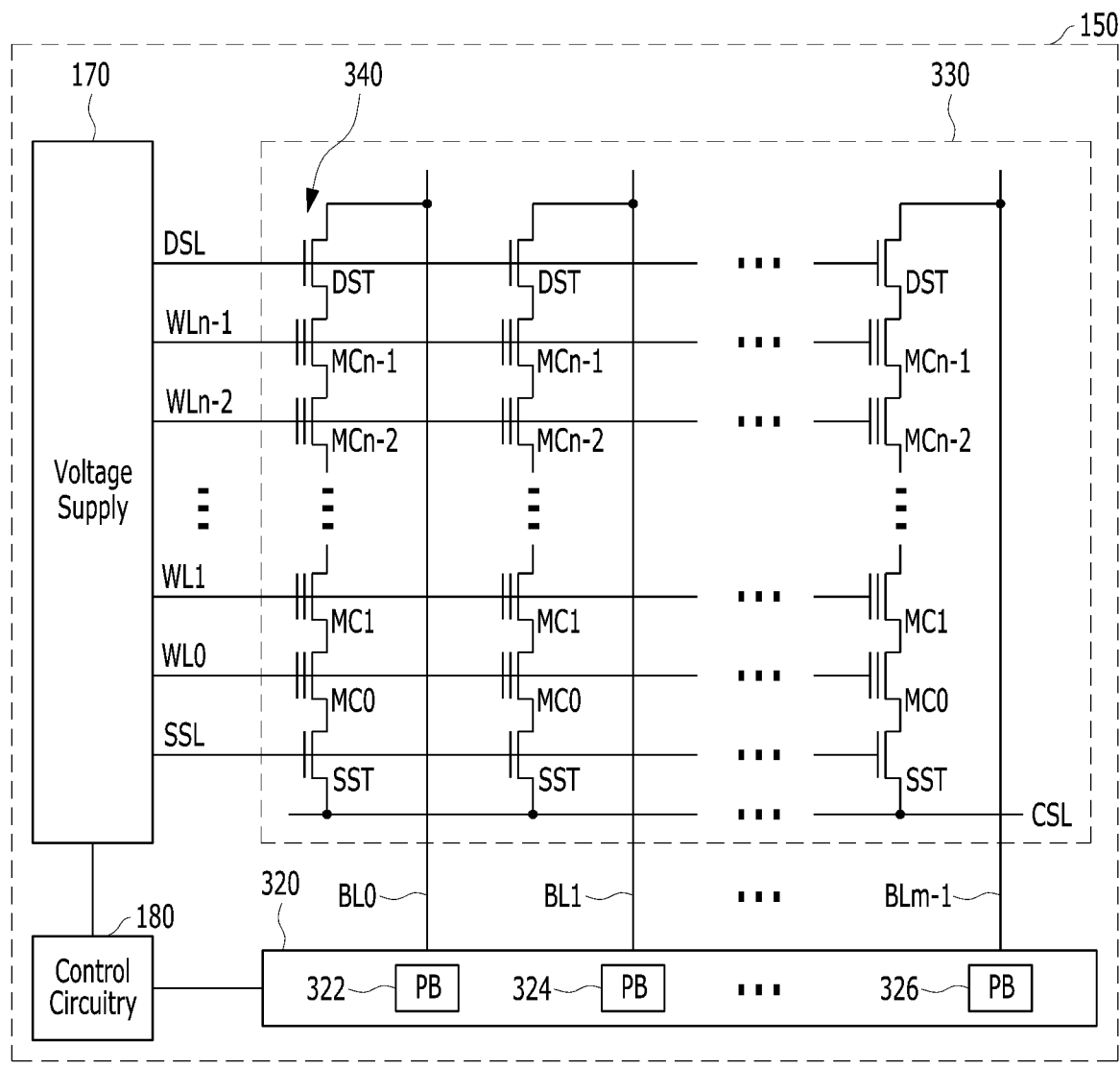
FIG. 1 illustrates a memory device according to an embodiment of the present disclosure.

Various embodiments of the present disclosure are described below with reference to the accompanying drawings. Elements and features of this disclosure, however, may be configured or arranged differently to form other embodiments, which may be variations of any of the disclosed embodiments.

In this disclosure, references to various features (e.g., elements, structures, modules, components, steps, operations, characteristics, etc.) included in "one embodiment," "example embodiment," "an embodiment," "another embodiment," "some embodiments," "various embodiments," "other embodiments," "alternative embodiment," and the like are intended to mean that any such features are included in one or more embodiments of the present disclosure, but may or may not necessarily be combined in the same embodiments.

In this disclosure, the terms "comprise," "comprising," "include," and "including" are open-ended. As used in the appended claims, these terms specify the presence of the stated elements and do not preclude the presence or addition of one or more other elements. The terms in a claim do not foreclose the apparatus from including additional components (e.g., an interface unit, circuitry, etc.).

In this disclosure, various units, circuits, or other components may be described or claimed as "configured to" perform a task or tasks. In such contexts, "configured to" is used to connote structure by indicating that the blocks/units/circuits/components include structure (e.g., circuitry) that performs one or more tasks during operation. As such, the block/unit/circuit/component can be said to be configured to perform the task even when the specified block/unit/circuit/component is not currently operational (e.g., is not turned on nor activated). The block/unit/circuit/component used with the "configured to" language include hardware, for example, circuits, memory storing program instructions executable to implement the operation, etc. Additionally, "configured to" can include a generic structure (e.g., generic circuitry) that is manipulated by software and/or firmware (e.g., an FPGA or a general-purpose processor executing software) to operate in manner that is capable of performing the task(s) at issue. "Configured to" may also include adapting a manufacturing process (e.g., a semiconductor fabrication facility) to fabricate devices (e.g., integrated circuits) that are adapted to implement or perform one or more tasks.

As used in the disclosure, the term 'circuitry' or 'logic' refers to all of the following: (a) hardware-only circuit implementations (such as implementations in only analog and/or digital circuitry) and (b) combinations of circuits and software (and/or firmware), such as (as applicable): (i) to a combination of processor(s) or (ii) to portions of processor(s)/software (including digital signal processor(s)), software, and memory(ies) that work together to cause an apparatus, such as a mobile phone or server, to perform various functions) and (c) circuits, such as a microprocessor(s) or a portion of a microprocessor(s), that require software or firmware for operation, even if the software or firmware is not physically present. This definition of 'circuitry' or 'logic' applies to all uses of this term in this application, including in any claims. As a further example, as used in this application, the term "circuitry" or "logic" also covers an implementation of merely a processor (or multiple processors) or portion of a processor and its (or their) accompanying software and/or firmware. The term "circuitry" or "logic" also covers, for example, and if applicable to a particular claim element, an integrated circuit for a storage device.

As used herein, the terms "first," "second," "third," and so on are used as labels for nouns that they precede, and do not imply any type of ordering (e.g., spatial, temporal, logical, etc.). The terms "first" and "second" do not necessarily imply that the first value must be written before the second value. Further, although the terms may be used herein to identify various elements, these elements are not limited by these terms. These terms are used to distinguish one element from another element that otherwise have the same or similar names. For example, a first circuitry may be distinguished from a second circuitry.

Further, the term "based on" is used to describe one or more factors that affect a determination. This term does not foreclose additional factors that may affect a determination. That is, a determination may be solely based on those factors or based, at least in part, on those factors. Consider the phrase "determine A based on B." While in this case, B is a factor that affects the determination of A, such a phrase does not foreclose the determination of A from also being based on C. In other instances, A may be determined based solely on B.

Herein, an item of data, a data item, a data entry or an entry of data may be a sequence of bits. For example, the data item may include the contents of a file, a portion of the file, a page in memory, an object in an object-oriented program, a digital message, a digital scanned image, a part of a video or audio signal, metadata or any other entity which can be represented by a sequence of bits. According to an embodiment, the data item may include a discrete object. According to another embodiment, the data item may include a unit of information within a transmission packet between two different components.

Embodiments described herein provide a data processing system and a method for operating the data processing system. The data processing system includes components and resources such as a memory system and a host, and is capable of dynamically allocating plural data paths used for data communication between the components based on usages of the components and the resources.

An embodiment of the present disclosure may provide an apparatus and method for erasing data stored in a non-volatile memory device.

According to an embodiment of the present disclosure, when a high-level voltage is applied to a bulk in which a plurality of non-volatile memory cells is located during an erase operation for erasing data stored in a memory block in a non-volatile memory device, the high-level voltage applied to the bulk causes charge accumulation at a channel in a string. Because accumulated charges might cause an adverse effect, an embodiment can provide an apparatus and a method capable of synchronizing charge discharge in a channel through a bit line and a common source line.

Further, according to an embodiment of the present disclosure, while the non-volatile memory device performs an erase operation, charges can be discharged from the channel of the string through the bit line and the common source line at a same speed or within a preset time difference. When a discharge speed at one side is faster than at the other side, negative boosting or under coupling where a word line is down coupled to a negative voltage can be avoided or reduced. Otherwise, when the discharge speed at one side is slower than at the other side, a phenomenon in which data stored in a non-volatile memory cell is not normally erased can be avoided or reduced.

Furthermore, according to an embodiment of the present disclosure, when charges in the channel of the string are discharged at a same speed or within a preset time difference through the bit line and the common source line during the erase operation performed in the non-volatile memory device, the memory device can uniformly control characteristics of the non-volatile memory cells, which may vary depending on the location of the non-volatile memory cells (e.g., closer to the bit line or closer to the common source line), so that operation reliability of the non-volatile memory cells can be improved.

In an embodiment, a memory device can include plural non-volatile memory cells which are capable of storing data and arranged in series between a bit line and a source line; and a control circuit configured to synchronize discharge of charges, which are accumulated in a channel formed by the plural non-volatile memory cells, through the bit line and the source line during an erase operation for erasing the data stored in the plural non-volatile memory cells.

The control circuit can be configured to control a level of voltage applied to a transistor included in the channel or an amount of current flowing through the channel to synchronize the discharge of charges in the channel through the bit line and the common source line at a same speed or within a preset time difference.

The control circuit can be configured to adjust a second speed of the discharge of charges through the bit line in response to a first speed of the discharge of charges through the source line to synchronize the discharge of charges in the channel through the bit line and the source line.

The control circuit can be configured to change a level of voltage applied to a gate of a second discharge transistor configured to apply a ground voltage to the bit line to adjust the second speed.

The control circuit can be configured to change the level of voltage applied to the gate of the second discharge transistor to change a resistance of the second discharge transistor.

The memory device can further include plural first discharge transistors individually configured to apply a ground voltage to the source line. The control circuit can be configured to selectively turn on the plural first discharge transistors to control a first speed of the discharge of charges through the source line to synchronize the discharge of charges in the channel through the bit line and the source line.

The memory device can further include at least one second discharge transistor configured to apply the ground voltage to the bit line. The control circuit can be configured to change a level of voltage applied to a gate of a second discharge transistor in response to turn-on of the plural first discharge transistors to synchronize the discharge of charges in the channel through the bit line and the source line.

The memory device can further include plural first discharge transistors individually configured to apply a ground voltage to the source line; and plural second discharge transistors individually configured to apply the ground voltage to the bit line. The control circuit can be configured to selectively turn on the plural first discharge transistors and the plural second discharge transistors to synchronize the discharge of charges in the channel through the bit line and the source line.

The control circuit can be configured to turn on a greater number of first discharge transistors among the plural first discharge transistors than the number of second discharge transistors turned on among the plural second discharge transistors.

The memory device can further include a first discharge transistor configured to apply a ground voltage to the source line; and a second discharge transistor configured to apply the ground voltage to the bit line. The control circuit can be configured to adjust levels of a first voltage and a second voltage applied to gates of the first discharge transistor and the second discharge transistor to control a first speed of the discharge of charges through the source line and a second speed of the discharge of charges through the bit line to synchronize the discharge of charges in the channel through the bit line and the source line.

The first voltage and the second voltage can be applied simultaneously. The first voltage can have a higher level than the second voltage.

In another embodiment, a memory system can include a memory device configured to store data; and a controller coupled to the memory device and configured to transmit a read, write, or erase command regarding the data. The memory device can include plural non-volatile memory cells arranged in series between a bit line and a source line; and a control circuit configured to synchronize discharge of charges, which are accumulated in a channel formed by the plural non-volatile memory cells, through the bit line and the source line in response to the erase command.

The control circuit can be configured to control a level of voltage applied to a transistor included in the channel or an amount of current flowing through the channel to synchronize the discharge of charges in the channel through the bit line and the source line at a same speed or within a preset time difference.

The control circuit can be configured to adjust a second speed of the discharge of charges through the bit line in response to a first speed of the discharge of charges through the source line to synchronize the discharge of charges in the channel through the bit line and the source line.

The control circuit can be configured to change a level of voltage applied to a gate of a second discharge transistor configured to apply a ground voltage to the bit line to adjust the second speed.

The memory device can further include plural first discharge transistors individually configured to apply a ground voltage to the source line. The control circuit can be configured to selectively turn on the plural first discharge transistors to control a first speed of the discharge of charges through the source line to synchronize the discharge of charges in the channel through the bit line and the source line.

The memory device can further include at least one second discharge transistor configured to apply the ground voltage to the bit line. The control circuit can be configured to change a level of voltage applied to a gate of a second discharge transistor in response to turn-on of the plural first discharge transistors to synchronize the discharge of charges in the channel through the bit line and the source line.

The memory device can further include plural first discharge transistors individually configured to apply a ground voltage to the source line; and plural second discharge transistors individually configured to apply the ground voltage to the bit line. The control circuit can be configured to selectively turn on the plural first discharge transistors and the plural second discharge transistors to synchronize the discharge of charges in the channel through the bit line and the source line. The control circuit is configured to turn on a greater number of first discharge transistors turned on among the plural first discharge transistors than the number of second discharge transistors among the plural second discharge transistors.

The memory device can further include a first discharge transistor configured to apply a ground voltage to the source line; and a second discharge transistor configured to apply the ground voltage to the bit line. The control circuit can be configured to adjust levels of first and second voltages applied to gates of the first and second discharge transistors to control a first speed of the discharge of charges through the source line and a second speed of the discharge of charges through the bit line to synchronize the discharge of charges in the channel through the bit line and the source line. The first and second voltages can be applied simultaneously. The first voltage can have a higher level than the second voltage.

In an embodiment, a method for operating memory system can include determining levels of an erase voltage and a gate voltage for erasing data stored in plural non-volatile memory cells in response to an erase command; applying an erase voltage to a bulk in which the plural non-volatile memory cells are located and applying a negative voltage or a ground voltage of 0V to a word line coupled to the plural non-volatile memory cells; controlling a discharge path of charges accumulated in a channel formed by the plural non-volatile memory cells through a bit line and a source line to synchronize a discharge rate or time through the bit line and the source line; and verifying whether the data is erased.

In another embodiment, a memory device can include a string of non-volatile memory cells arranged in series between a bit line and a source line; a first discharge circuit configured to discharge, at a first time point, the source line by a first discharge amount for a first discharge time length by referring to a register configured to store therein information on the first time point, the first discharge amount and the first discharge time length; a second discharge circuit configured to discharge, at a second time point, the bit line by a second discharge amount for a second discharge time length; and a control circuit configured to control the first and second discharge circuits to operate during an erase operation on the string by determining the second time point, the second discharge amount and the second discharge time length based on the information.

Embodiments will now be described with reference to the accompanying drawings, wherein like numbers reference like elements.

FIG. 1 illustrates a memory device 150 that includes a memory cell array circuit formed in a memory die according to an embodiment of the present disclosure.

Referring to FIG. 1, the memory device 150 may include at least one memory group 330 having a plurality of cell strings 340. Each cell string 340 may include a plurality of non-volatile memory cells MC0 to MCn−1 connected to a respective one of a plurality of bit lines BL0 to BLm−1. The cell strings 340 are disposed in respective columns of the memory group 330, and each cell string 340 can include at least one drain select transistor DST and at least one source select transistor SST.

The non-volatile memory cells MC0 to MCn−1 of each cell string 340 may be connected in series between a drain select transistor DST and a source select transistor SST. Each of the non-volatile memory cells MC0 to MCn−1 may be configured as a multi-level cell (MLC) that stores a data item having plural bits per cell. The cell strings 340 may be electrically connected to corresponding bit lines of the bit lines BL0 to BLm−1.

In an embodiment, the memory group 330 may include NAND-type flash memory cells MC0 to MCn−1. In another embodiment, the memory group 330 can be implemented as a NOR-type flash memory, a hybrid flash memory in which at least two different types of memory cells are mixed or combined, or a one-chip NAND flash memory in which a controller is embedded in a single memory chip. In an embodiment, the memory group 330 can include a flash memory cell including a charge trap flash (CTF) layer that includes a conductive floating gate or insulating layer.

Figure 2:
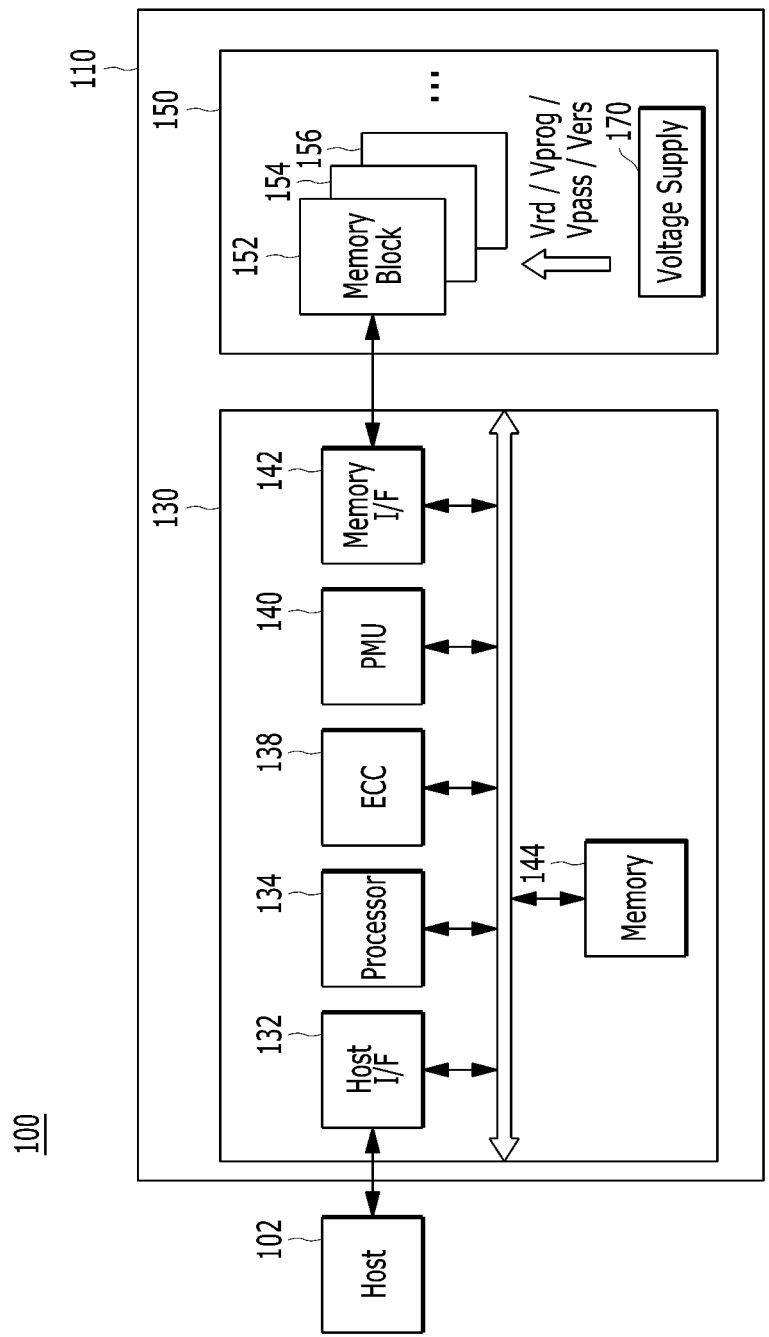
FIG. 2 illustrates a data processing system according to an embodiment of the present disclosure.

FIG. 2 shows a memory system 110 which may include the memory device 150 according to an embodiment of the present disclosure. In this embodiment, the memory group 330 in memory device 150 may include one or more memory blocks 152, 154, 156. According to an embodiment, the memory device 150 can have a two-dimensional (2D) or three-dimensional (3D) structure. For example, each of the memory blocks 152, 154, 156 in the memory device 150 may be implemented as a 3D structure, i.e., a vertical structure. Each of the memory blocks 152, 154, 156 may have a three-dimensional structure extending along first to third directions, for example, an x-axis direction, a y-axis direction, and a z-axis direction.

The memory group 330 including the plurality of memory blocks 152, 154, 156 can be coupled to a plurality of bit lines BL, a plurality of string select lines SSL, and a plurality of drain select lines DSL, a plurality of word lines WL, a plurality of dummy word lines DWL, and a plurality of common source lines CSL. In an embodiment, the memory group 330 can include a plurality of NAND strings NS which, for example, may respectively correspond to cell strings 340. Each NAND string NS may include a plurality of memory cells MC and may be connected to a respective bit line of the bit lines BL. In addition, the string select transistor SST of each NAND string NS may be connected to a common source line CSL, and the drain select transistor DST of each NAND string NS can be connected to a corresponding bit line BL. In each NAND string NS, the memory cells MC may be arranged between the string select transistor SST and the drain select transistor DST.

Referring to FIGS. 1 and 2, the memory device 150 may include a voltage supply circuit 170 which can supply a word line voltage (e.g., one or more predetermined voltages such as a program voltage, a read voltage, and a pass voltage) for respective word lines according to an operation mode, or may supply a voltage to a bulk, e.g., a well region, in which each memory block including the memory cells MC are formed. In this case, a voltage generating operation of the voltage supply circuit 170 may be performed under a control of a control circuitry 180. Also, the voltage supply circuit 170 may generate a plurality of variable read voltages to distinguish a plurality of data items from each other.

In response to the control of the control circuit, one of the memory blocks or sectors of the memory cell array may be selected, and one of the word lines of the selected memory block may be selected. Word line voltages may be supplied to the selected word line and the unselected word line, individually. The voltage supply circuit 170 may include a voltage generation circuit (e.g., refer to FIGS. 4 to 8) for generating target voltages having various levels.

In an embodiment, the voltage supply circuit 170 may be coupled to a first pin or pad receiving a first power voltage VCC applied from the outside, e.g., an external device, and a second pin or pad receiving the second power voltage VPP applied from the external device. The second power voltage VPP may have a greater voltage level, e.g., twice or more higher than, than that of the first power voltage VCC. For example, the first power voltage VCC may have a voltage level of 2.0V to 5.5V, while the second power supply voltage may have a voltage level of 9V to 13V.

According to an embodiment, the voltage supply circuit 170 can include a voltage generation circuit for more rapidly generating the target voltages of various levels used in the memory group 330. The voltage generation circuit can use the second power supply voltage VPP to generate a target voltage, which may have a higher voltage level than the second power supply voltage VPP.

The memory device 150 may also include a read/write circuit 320 controlled by the control circuitry 180. The read/write circuit 320 may operate as a sense amplifier or a write driver according to an operation mode. For example, in a verify operation and a read operation, the read/write circuit 320 may operate as a sense amplifier for reading the data item from the memory cell array. In a program operation, the read/write circuit 320 may operate as a write driver that controls potentials of bit lines according to a data item to be stored in the memory cell array. The read/write circuit 320 may receive the data item to be programmed to the cell array from page buffers during the program operation. The read/write circuit 320 can drive bit lines based on the input data item. To this end, the read/write circuit 320 may include a plurality of page buffers (PB) 322, 324, 326, with each page buffer corresponding to each column or each bit line, or each column pair or each bit line pair. According to an embodiment, a plurality of latches may be included in each of the page buffers 322, 324, 326.

The page buffers 322, 324, 326 may be coupled to a data input/output device, e.g., a serialization circuit or a serializer, through a plurality of buses BUS. When each of the page buffers 322, 324, 326 is coupled to the data input/output device through different buses, a delay that may occur in data transmission from the page buffers 322, 324, 326 can be reduced. For example, each page buffer 322, 324, 326 can perform the data transmission without a waiting time.

According to an embodiment, the memory device 150 may receive a write command, write data, and information, e.g., a physical address, regarding a location in which the write data is to be stored. The control circuitry 180 causes the voltage supply circuit 170 to generate a program pulse, a pass voltage, etc., used for a program operation performed in response to a write command, and to generate one or more voltages used for a verification operation performed after the program operation.

When a multi-bit data item is programmed in non-volatile memory cells included in the memory group 330, the error rate might be higher than that when a single-bit data item is stored in the non-volatile memory cells. For example, an error in the non-volatile memory cells may be induced due to cell-to-cell interference (CCI). In order to reduce error in the non-volatile memory cells, a width (deviation) of a threshold voltage distribution (corresponding to stored data items between the non-volatile memory cells) should be reduced.

To this end, the memory device 150 can perform an incremental step pulse programming (ISPP) operation to effectively make a narrow threshold voltage distribution of the non-volatile memory cells. In an embodiment, the memory device 150 can use the ISPP operation for multi-step program operations. For example, the memory device 150 may divide a program operation into a Least Significant Bit (LSB) program operation and a Most Significant Bit (MSB) operation according to a predetermined order between the non-volatile memory cells or pages.

According to an embodiment, it is possible to provide an apparatus and method which is capable of reducing a time for discharging a bit line or a channel between program pulse applications during a data programming operation accomplished by applying a plurality of program pulses to memory cells in a memory device. When a discharge time could be reduced, the speed of the program operation of the memory device may be increased. For example, in order to discharge a bit line or a channel in the memory device, the memory device can control or adjust the voltage level of a bit line select line or a drain select line (DSL), in order to avoid a transistor being in a floating state when controlled through the bit line select line or the drain select line (DSL). Because the transistor is in the floating state, the bit line or channel could not be discharged appropriately.

In an embodiment, a memory device can adjust and change a setup time for adjusting a potential of a bit line after applying a program pulse during a unit programming operation in which a program pulse to memory cell is applied to a non-volatile memory cell in the memory device. As a result, it is possible to provide an apparatus and method that is capable of increasing the speed of the program operation and/or improving program operation efficiency.

For example, during an operation of applying a plurality of program pulses to non-volatile memory cells in the memory device in order to program the non-volatile memory cells with multi-bit data, the memory device can perform a unit program operation in which a second program pulse is applied after a first program pulse has been applied, in one of various modes.

The modes of the unit program operation can include a first program mode, a second program mode, and a third program mode. In the first program mode, the degree to which data is programmed in response to the second program pulse, e.g., a change or a shift of threshold voltage in a non-volatile memory cell when the second program pulse is applied, may be similar to or greater than the degree to which data is programmed in response to the first program pulse. In the second program mode, the degree to which data is programmed in response to the second program pulse is smaller than the degree to which data is programmed in response to the first program pulse. In the third program mode, the degree to which data is programmed in response to the second program pulse is non-existent, e.g., there is no change or no shift of the threshold voltage in the non-volatile memory cell even when the second program pulse is applied. The mode could be achieved based on a potential of the bit line coupled to a target memory cell when a program pulse is applied. If the discharge time could be reduced, the memory device can improve the efficiency or speed of the data program operation by adjusting and changing the setup time used to change or discharge the potential of the bit line.

According to an embodiment, the memory device can change or adjust a control voltage applied through the bit line select line or the drain select line (DSL) in response to a program operation environment, e.g., temperature, and a level (or size) or a number of applications regarding a program pulse applied to non-volatile memory cells during the data program operation. Accordingly, the memory device may reduce an operation margin corresponding to each program pulse during the data programming operation by applying a plurality of program pulses to a non-volatile memory cell. This may reduce the time spent on performing the data programming operation.

Referring again to FIG. 2, the memory device 150 is shown as included in a data processing system 100. According to an embodiment, the data processing system 100 may include a host 102 engaged or coupled with a memory system, such as memory system 110. For example, the host 102 and the memory system 110 can be coupled to each other via a data bus, a host cable and the like to perform data communication.

The memory system 110 may include the memory device 150 and a controller 130. The memory device 150 and the controller 130 in the memory system 110 may be considered components or elements physically separated from each other. The memory device 150 and the controller 130 may be connected via at least one data path. For example, the data path may include a channel and/or a way.

According to an embodiment, the memory device 150 and the controller 130 may be components or elements that are functionally divided. Further, according to an embodiment, the memory device 150 and the controller 130 may be implemented in a single chip or in a plurality of chips. The controller 130 may perform a data input/output operation in response to a request input from the external device. For example, when the controller 130 performs a read operation in response to a read request input from an external device, data stored in a plurality of non-volatile memory cells included in the memory device 150 is transferred to the controller 130.

In FIG. 2, the memory device 150 may include one or more memory blocks 152, 154, 156. The memory block 152, 154, 156 may be understood as a group of non-volatile memory cells in which data is removed together by a single erase operation. The memory block 152, 154, 156 may include at least one page, e.g., a group of non-volatile memory cells that store data together during a single program operation and/or that output data together during a single read operation. For example, one memory block may include a plurality of pages.

In an embodiment, the memory device 150 may include a plurality of memory planes or one or more memory dies. According to an embodiment, the memory plane may be considered a logical or a physical partition including at least one memory block, a driving circuit capable of controlling an array of a plurality of non-volatile memory cells, and a buffer that can temporarily store data input to, or output from, non-volatile memory cells.

According to an embodiment, each memory die may include at least one memory plane and may be understood as a set of components implemented on a physically distinguishable substrate. Each memory die may be connected to the controller 130 through a data path, and may include an interface to exchange an item of data and a signal with the controller 130.

According to an embodiment, the memory device 150 may include at least one memory block 152, 154, 156, at least one memory plane, or at least one memory die. The internal configuration of the memory device 150 (e.g., shown in FIG. 1) may be different according to performance of the memory system 110. An embodiment of the present disclosure is not limited to the internal configuration shown in FIG. 2.

In FIG. 2, the memory device 150 includes the voltage supply circuit 170 which is capable of supplying one or more voltages to the memory block(s) 152, 154, 156. The voltage supply circuit 170 can include a voltage generation circuit for generating target voltages for the memory block(s) 152, 154, 156, for example, as described with reference to FIGS. 4 to 8.

In an embodiment, the voltage supply circuit 170 may supply a read voltage Vrd, a program voltage Vprog, a pass voltage Vpass, or an erase voltage Vers into a non-volatile memory cell included in the memory block. For example, during a read operation for reading data stored in the non-volatile memory cell in the memory block(s) 152, 154, 156, the voltage supply circuit 170 may supply the read voltage Vrd to a selected non-volatile memory cell. During the program operation for storing data in the non-volatile memory cell in the memory block(s) 152, 154, 156, the voltage supply circuit 170 may supply the program voltage Vprog into a selected non-volatile memory cell. During a read operation or a program operation performed on the selected non-volatile memory cell, the voltage supply circuit 170 may supply a pass voltage Vpass to a non-selected non-volatile memory cell. During the erasing operation for erasing data stored in the non-volatile memory cell in the memory block(s) 152, 154, 156, the voltage supply circuit 170 may supply the erase voltage Vers to the memory block.

The memory device 150 may store information regarding various voltages which are supplied to the memory block(s) 152, 154, 156 based on which operation is performed. For example, when a non-volatile memory cell in the memory block(s) 152, 154, 156 can store multi-bit data, plural levels of the read voltage Vrd for recognizing or reading the multi-bit data item may be used. The memory device 150 may include a table with information indicating plural levels of the read voltage Vrd corresponding to the multi-bit data item. For example, the table can include bias values stored in a register, with each bias value corresponding to a specific level of the read voltage Vrd. The number of bias values for the read voltage Vrd that is used for a read operation may be limited to a preset range. Also, in an embodiment, the bias values can be quantized.

The host 102 may include a portable electronic device (e.g., a mobile phone, an MP3 player, a laptop computer, etc.) or a non-portable electronic device (e.g., a desktop computer, a game player, a television, a projector, etc.). According to an embodiment, the host 102 can include a central processing unit (CPU) included in the portable electronic device and the non-portable electronic device.

The host 102 may include at least one operating system (OS), which can control functions and operations performed in the host 102. The OS can provide interoperability between the host 102 engaged operatively with the memory system 110 and a user who intends to store data in the memory system 110. The OS may support functions and operations corresponding to user requests. By way of example but not limitation, the OS can be classified into a general operating system and a mobile operating system according to mobility of the host 102. The general operating system may be split into a personal operating system and an enterprise operating system according to system requirements or a user environment. As compared with the personal operating system, the enterprise operating systems can be specialized for securing and supporting high performance computing.

The mobile operating system may be subject to support services or functions for mobility, e.g., a power saving function. The host 102 may include a plurality of operating systems. The host 102 may execute multiple operating systems interlocked with the memory system 110, corresponding to a user request. The host 102 may transmit a plurality of commands corresponding to user requests to the memory system 110, thereby performing operations corresponding to the plurality of commands within the memory system 110.

The controller 130 may control the memory device 150 in response to a request or a command from the host 102. For example, the controller 130 may perform a read operation to provide data read from the memory device 150 to the host 102 and may perform a write operation (or a program operation) to store data input from the host 102 in the memory device 150. In order to perform data input/output (I/O) operations, the controller 130 may control and manage internal operations of reading data, programming data, erasing data, or the like.

According to an embodiment, the controller 130 may include a host interface (I/F) 132, a processor 134, error correction circuitry (ECC) 138, a power management unit (PMU) 140, a memory interface (I/F) 142, and a memory 144. Components in the controller 130 as illustrated in FIG. 2 may vary according to structures, functions, operation performance, or the like, regarding the memory system 110.

For example, the memory system 110 may be implemented with any of various types of storage devices electrically coupled with the host 102 according to a protocol of a host interface. Non-limiting examples of suitable storage devices include a solid state drive (SSD), a multimedia card (MMC), an embedded MMC (eMMC), a reduced size MMC (RS-MMC), a micro-MMC, a secure digital (SD) card, a mini-SD, a micro-SD, a universal serial bus (USB) storage device, a universal flash storage (UFS) device, a compact flash (CF) card, a smart media (SM) card, a memory stick, and the like. Components may be added to or omitted from the controller 130 according to implementation of the memory system 110.

Each of the host 102 and the memory system 110 may include a controller or an interface for transmitting and receiving signals, data, and the like, in accordance with one or more predetermined protocols. For example, the host interface 132 in the memory system 110 may include an apparatus capable of transmitting signals, data, and the like to the host 102 or receiving signals, data, and the like from the host 102.

The host interface 132 may receive signals, commands (or requests), and/or data input from the host 102. For example, the host 102 and the memory system 110 may use a predetermined protocol to transmit and receive data therebetween. Examples of communication standards or interfaces supported by the host 102 and the memory system 110 for sending and receiving data include Universal Serial Bus (USB), Multi-Media Card (MMC), Parallel Advanced Technology Attachment (PATA), Small Computer System Interface (SCSI), Enhanced Small Disk Interface (ESDI), Integrated Drive Electronics (IDE), Peripheral Component Interconnect Express (PCIe or PCI-e), Serial-attached SCSI (SAS), Serial Advanced Technology Attachment (SATA), Mobile Industry Processor Interface (MIPI), and the like. According to an embodiment, the host interface 132 is a type of layer for exchanging data with the host 102 and is implemented with, or driven by, firmware called a host interface layer (HIL).

The Integrated Drive Electronics (IDE) or Advanced Technology Attachment (ATA) may be used as one of the interfaces for transmitting and receiving data and, for example, may use a cable including 40 wires connected in parallel to support data transmission and data reception between the host 102 and the memory system 110. When a plurality of memory systems 110 are connected to a single host 102, the plurality of memory systems 110 may be divided into a master and a slave using a position or a dip switch to which the plurality of memory systems 110 are connected. The memory system 110 set as the master may be used as a main memory device. The IDE (ATA) may include, for example, Fast-ATA, ATAPI, or Enhanced IDE (EIDE).

A Serial Advanced Technology Attachment (SATA) interface is a type of serial data communication interface that is compatible with various ATA standards of parallel data communication interfaces used by Integrated Drive Electronics (IDE) devices. The 40 wires in the IDE interface can be reduced to six wires in the SATA interface. For example, 40 parallel signals for the IDE can be converted into 6 serial signals for the SATA interface. The SATA interface has been widely used because of its faster data transmission and reception rate and its less resource consumption in the host 102 used for the data transmission and reception. The SATA interface may connect up to 30 external devices to a single transceiver included in the host 102. In addition, the SATA interface can support hot plugging that allows an external device to be attached to or detached from the host 102, even while data communication between the host 102 and another device is being executed. Thus, the memory system 110 can be connected or disconnected as an additional device, like a device supported by a universal serial bus (USB) even when the host 102 is powered on. For example, in the host 102 having an eSATA port, the memory system 110 may be freely attached to or detached from the host 102 like an external hard disk.

Small Computer System Interface (SCSI) is a type of serial data communication interface used for connecting a computer or a server with other peripheral devices. The SCSI can provide high transmission speed compared with other interfaces such as IDE and SATA. In the SCSI, the host 102 and at least one peripheral device (e.g., memory system 110) are connected in series, but data transmission and reception between the host 102 and each peripheral device may be performed through a parallel data communication. In the SCSI, it is easy to connect or disconnect a device such as the memory system 110 to or from the host 102. The SCSI can support connections of 15 other devices to a single transceiver included in host 102.

Serial Attached SCSI (SAS) can be understood as a serial data communication version of the SCSI. In SAS, the host 102 and a plurality of peripheral devices are connected in series, and data transmission and reception between the host 102 and each peripheral device may be performed in a serial data communication scheme. Also, SAS can support connection between the host 102 and the peripheral device through a serial cable instead of a parallel cable, to easily manage equipment using the SAS and enhance or improve operational reliability and communication performance. Also, SAS may support connections of eight external devices to a single transceiver included in the host 102.

The Non-volatile memory express (NVMe) is a type of interface based at least on a Peripheral Component Interconnect Express (PCIe) designed to increase performance and design flexibility of the host 102, servers, computing devices, and the like equipped with the non-volatile memory system 110. PCIe can use a slot or a specific cable for connecting a computing device (e.g., host 102) and a peripheral device (e.g., memory system 110). For example, PCIe can use a plurality of pins (e.g., 18 pins, 32 pins, 49 pins, or 82 pins) and at least one wire (e.g., x1, x4, x8, or x16) to achieve high speed data communication over several hundred MB per second (e.g., 250 MB/s, 500 MB/s, 984.6250 MB/s, or 1969 MB/s). According to an embodiment, a PCIe scheme may achieve bandwidths of tens to hundreds of Giga bits per second. NVMe can support an operation speed of the non-volatile memory system 110, such as an SSD, that is faster than a hard disk.

According to an embodiment, the host 102 and the memory system 110 may be connected through a universal serial bus (USB). The Universal Serial Bus (USB) is a type of scalable, hot-pluggable plug-and-play serial interface that can provide cost-effective standard connectivity between the host 102 and peripheral devices, e.g., a keyboard, a mouse, a joystick, a printer, a scanner, a storage device, a modem, a video camera, and the like. A plurality of peripheral devices such as the memory system 110 may be coupled to a single transceiver included in the host 102.

The error correction circuitry 138 can correct error bits of data read from the memory device 150, and may include an error correction code (ECC) encoder and an ECC decoder. The ECC encoder may perform error correction encoding of data to be programmed in the memory device 150 in order to generate encoded data into which a parity bit is added. The encoded data may be stored in memory device 150. The ECC decoder can detect and correct error bits contained in the data read from the memory device 150 when the controller 130 reads the data stored in the memory device 150. For example, after performing error correction decoding on the data read from the memory device 150, the error correction circuitry 138 determines whether the error correction decoding has succeeded or not and outputs an instruction signal (e.g., a correction success signal or a correction fail signal) based on a result of the error correction decoding. The error correction circuitry 138 may use a parity bit generated during the ECC encoding process for the data stored in the memory device 150, in order to correct the error bits of the read data. When the number of the error bits is greater than or equal to the number of correctable error bits, the error correction circuitry 138 may not correct the error bits and instead may output the correction fail signal indicating failure in correcting the error bits.

According to an embodiment, the error correction circuitry 138 may perform an error correction operation based on coded modulation. Examples include a low density parity check (LDPC) code, a Bose-Chaudhuri-Hocquenghem (BCH) code, a turbo code, a Reed-Solomon (RS) code, a convolution code, a recursive systematic code (RSC), a trellis-coded modulation (TCM), a Block coded modulation (BCM), or the like. The error correction circuitry 138 may include all circuits, modules, systems, and/or devices for performing the error correction operation based on at least one of the above described codes. In one embodiment, the error correction circuitry 138 can include at least some of components in the controller 130 shown in FIG. 1.

The ECC decoder may perform hard decision decoding or soft decision decoding on data transmitted from the memory device 150. Hard decision decoding can be understood as one of two methods broadly classified for error correction. Hard decision decoding may include, for example, an operation of correcting an error bit by reading digital data of '0' or '1' from a non-volatile memory cell in the memory device 150. Because the hard decision decoding handles a binary logic signal, the circuit/algorithm design or configuration may be simpler and a processing speed may be faster than the soft decision decoding.

Soft decision decoding may quantize a threshold voltage of a non-volatile memory cell in the memory device 150 by two or more quantized values, e.g., multiple bit data, approximate values, an analog value, and the like, in order to correct an error bit based on the two or more quantized values. The controller 130 can receive two or more alphabets or quantized values from a plurality of non-volatile memory cells in the memory device 150, and then perform a decoding based on information generated by characterizing the quantized values as a combination of information such as conditional probability or likelihood.

According to an embodiment, the ECC decoder may use low-density parity-check and generator matrix (LDPC-GM) code among methods designed for the soft decision decoding. A low-density parity-check (LDPC) code uses an algorithm that can read values of data from the memory device 150 in several bits according to reliability, not simply data of 1 or 0 like the hard decision decoding, and iteratively repeats it through a message exchange in order to improve reliability of the values. Then, the values are finally determined as data of 1 or 0. For example, a decoding algorithm using LDPC codes can be understood as probabilistic decoding. Hard decision decoding in which a value output from a non-volatile memory cell, is coded as 0 or 1.

Compared to hard decision decoding, soft decision decoding can determine the value stored in the non-volatile memory cell based on the stochastic information. Regarding bit-flipping which may be considered an error that can occur in the memory device 150, soft decision decoding may provide an improved probability of correcting the error and recovering data, as well as providing reliability and stability of corrected data. The LDPC-GM code may have a scheme in which internal low-density generator matrix (LDGM) codes can be concatenated in series with high-speed LDPC codes.

According to an embodiment, the ECC decoder may use, for example, low-density parity-check convolutional codes (LDPC-CCs) for the soft decision decoding. The LDPC-CCs may correspond to a scheme using a linear time encoding and a pipeline decoding based on a variable block length and a shift register.

According to an embodiment, the ECC decoder may use, for example, a Log Likelihood Ratio Turbo Code (LLR-TC) for soft decision decoding. A Log Likelihood Ratio (LLR) may be calculated as a non-linear function for a distance between a sampled value and an ideal value. In addition, a Turbo Code (TC) may include a simple code (for example, a Hamming code) in two or three dimensions and repeat decoding in a row direction and a column direction to improve reliability of values.

The power management unit (PMU) 140 may control electrical power provided to the controller 130. The PMU 140 may monitor the electrical power supplied to the memory system 110, e.g., a voltage supplied to the controller 130, and provide the electrical power to components included in the controller 130. The PMU 140 may not only detect power-on or power-off, but may also generate a trigger signal to enable the memory system 110 to urgently back up a current state when the electrical power supplied to the memory system 110 is unstable. According to an embodiment, the PMU 140 may include a device or a component capable of accumulating electrical power that may be used in an emergency.

The memory interface 142 may serve as an interface for handling commands and data transferred between the controller 130 and the memory device 150, in order to allow the controller 130 to control the memory device 150 in response to a command or a request input from the host 102. When the memory device 150 is a flash memory, the memory interface 142 may generate a control signal for the memory device 150 and may process data input to, or output from, the memory device 150 under the control of the processor 134.

For example, when the memory device 150 includes a NAND flash memory, the memory interface 142 includes a NAND flash controller (NFC). The memory interface 142 can provide an interface for handling commands and data between the controller 130 and the memory device 150. In accordance with an embodiment, the memory interface 142 can be implemented through, or driven by, firmware called a Flash Interface Layer (FIL) for exchanging data with the memory device 150.

According to an embodiment, the memory interface 142 may support an open NAND flash interface (ONFi), a toggle mode, or the like, for data input/output with the memory device 150. For example, the ONFi may use a data path, e.g., a channel, a way, etc., that includes at least one signal line capable of supporting bi-directional transmission and reception in a unit of 8-bit or 16-bit data. Data communication between the controller 130 and the memory device 150 can be achieved through at least one interface regarding an asynchronous single data rate (SDR), a synchronous double data rate (DDR), a toggle double data rate (DDR), or the like.

The memory 144 may be used as a working memory of the memory system 110 or the controller 130, while temporarily storing transactional data of operations performed in the memory system 110 and the controller 130. For example, the memory 144 may temporarily store read data output from the memory device 150 in response to a read request from the host 102 before the read data is output to the host 102.

In addition, the controller 130 may temporarily store write data input from the host 102 in the memory 144 before programming the write data in the memory device 150. When the controller 130 controls operations such as a data read operation, a data write or program operation, a data erase operation, etc., of the memory device 150, data transmitted between the controller 130 and the memory device 150 of the memory system 110 may be temporarily stored in the memory 144.

In addition to the read data or write data, the memory 144 may store information, e.g., map data, read requests, program requests, etc., used for inputting or outputting data between the host 102 and the memory device 150. According to an embodiment, the memory 144 may include one or more of a command queue, a program memory, a data memory, a write buffer/cache, a read buffer/cache, a data buffer/cache, a map buffer/cache, and so on. The controller 130 may allocate some storage space in the memory 144 for a component which is established to carry out a data input/output operation. For example, the write buffer established in the memory 144 may be used to temporarily store target data subject to a program operation.

In an embodiment, the memory 144 may be implemented with a volatile memory. For example, the memory 144 may be implemented with a static random access memory (SRAM), a dynamic random access memory (DRAM), or both. Although FIG. 2 illustrates that the memory 144 disposed within the controller 130, embodiments are not limited thereto. The memory 144 may be located within or external to the controller 130. For instance, the memory 144 may be embodied by an external volatile memory having a memory interface for transferring data and/or signals between the memory 144 and the controller 130.

The processor 134 may control overall operations of the memory system 110. For example, the processor 134 can control a program operation or a read operation of the memory device 150 in response to a write request or a read request entered from the host 102. According to an embodiment, the processor 134 may execute firmware to control the program operation or the read operation in the memory system 110. The firmware may be, for example, a flash translation layer (FTL). According to an embodiment, the processor 134 may be implemented with a microprocessor, a central processing unit (CPU), or another processing device.

According to an embodiment, the memory system 110 may be implemented with at least one multi-core processor. The multi-core processor is a type of circuit or chip in which two or more cores, which are considered distinct processing regions, are integrated. For example, when a plurality of cores in the multi-core processor drive or execute a plurality of flash translation layers (FTLs) independently, a data input/output speed (or performance) of the memory system 110 may be improved. According to an embodiment, the data input/output (I/O) operations in the memory system 110 may be independently performed through different cores in the multi-core processor.

The processor 134 in the controller 130 may perform an operation corresponding to a request or a command input from the host 102. Further, the memory system 110 may perform an operation independent from a command or a request input from the host 102. In one case, an operation performed by the controller 130 in response to the request or the command input from the host 102 may be considered a foreground operation, while an operation performed by the controller 130 independently from the request or the command input from the host 102 may be considered a background operation. The controller 130 can perform foreground or background operations for reading, writing, or erasing data in the memory device 150. In addition, a parameter set operation corresponding to a set parameter command or a set feature command as a set command transmitted from the host 102 may be considered a foreground operation. Examples of background operations that may be performed without a command transmitted from the host 102 are, the controller 130 can perform garbage collection (GC), wear leveling (WL), bad block management for identifying and processing bad blocks, or the like.

According to an embodiment, substantially similar operations may be performed as both the foreground operation and the background operation. For example, when the memory system 110 performs garbage collection in response to a request or a command input from the host 102 (e.g., manual GC), the garbage collection can be considered a foreground operation. When the memory system 110 performs garbage collection independently of the host 102 (e.g., auto GC), the garbage collection can be considered a background operation.

When the memory device 150 includes a plurality of dies (or a plurality of chips) each including a plurality of non-volatile memory cells, the controller 130 may perform parallel processing regarding plural requests or commands input from the host 102 in order to improve performance of the memory system 110. For example, the transmitted requests or commands may be divided into plural groups including at least some of a plurality of planes, a plurality of dies, or a plurality of chips included in the memory device 150, and the plural groups of requests or commands are processed individually or in parallel in each plane, each die or each chip.

The memory interface 142 in the controller 130 may be connected to the plurality of dies or chips in the memory device 150 through at least one channel and at least one way. When the controller 130 distributes and stores data in the plurality of dies through each channel or each way in response to requests or commands associated with a plurality of pages including non-volatile memory cells, a plurality of operations corresponding to the requests or the commands can be performed simultaneously or in parallel in the plurality of dies or planes. Such a processing method or scheme can be considered as an interleaving method. Because a data input/output speed of the memory system 110 increases by operating with the interleaving method, data I/O performance of the memory system 110 can be improved.

By way of example but not limitation, the controller 130 can recognize statuses of a plurality of channels (or ways) associated with the plurality of dies included in the memory device 150. The controller 130 may determine a status of each channel or each way as one of a busy status, a ready status, an active status, an idle status, a normal status, and an abnormal status. The determination of which channel or way an instruction (and/or a data) is delivered through by the controller 130 can be associated with a physical block address. The controller 130 may refer to descriptors delivered from the memory device 150. The descriptors may include a block or page of parameters describing something about the memory device 150. The descriptors can have a predetermined format or structure. For instance, the descriptors may include device descriptors, configuration descriptors, unit descriptors, and the like. The controller 130 may refer to, or use, the descriptors to determine which channel(s) or way(s) is used to exchange an instruction or data.

As above described, the memory device 150 in the memory system 110 may include one or more memory blocks 152, 154, 156. Each of the memory blocks 152, 154, 156 includes a plurality of non-volatile memory cells. According to an embodiment, the memory blocks 152, 154, 156 can be a group of non-volatile memory cells erased together. The memory blocks 152, 154, 156 may include a plurality of pages which is a group of non-volatile memory cells read or programmed together.

In an embodiment, each of the memory blocks 152, 154, 156 may have a three-dimensional stack structure for high integration. Further, the memory device 150 may include a plurality of dies, each die including a plurality of planes, each plane including the memory blocks 152, 154, 156. A configuration of the memory device 150 may be changed depending on performance of the memory system 110.

In FIG. 2, the memory device 150 includes memory blocks 152, 154, and 156 which may be any of single-level cell (SLC) memory blocks, multi-level cell (MLC) memory blocks, or the like, based on the number of bits that can be stored in one memory cell. An SLC memory block includes a plurality of pages implemented by memory cells, each memory cell storing one bit of data. An SLC memory block may have higher data I/O operation performance and higher durability than the MLC memory block. The MLC memory block includes a plurality of pages implemented by memory cells, with each memory cell storing multi-bit data, e.g., two or more bits of data. The MLC memory block may have larger storage capacity for the same space compared to the SLC memory block. The MLC memory block can be highly integrated in view of storage capacity.

In an embodiment, the memory device 150 may be implemented with MLC memory blocks such as a double level cell (DLC) memory block, a triple-level cell (TLC) memory block, a quadruple-level cell (QLC) memory block, and a combination thereof. A DLC memory block may include a plurality of pages implemented by memory cells, with each memory cell capable of storing 2-bit data. A TLC memory block can include a plurality of pages implemented by memory cells, with each memory cell capable of storing 3-bit data. A QLC memory block can include a plurality of pages implemented by memory cells, with each memory cell capable of storing 4-bit data. In another embodiment, the memory device 150 can be implemented with a block including a plurality of pages implemented by memory cells, with each memory cell capable of storing five or more bits of data.

According to an embodiment, the controller 130 may use an MLC memory block included in the memory device 150 as an SLC memory block that stores one-bit data in one memory cell. A data input/output speed of the multi-level cell (MLC) memory block can be slower than that of the SLC memory block. For example, when the MLC memory block is used as the SLC memory block, the margin for a read or program operation can be reduced. For example, the controller 130 may perform a data input/output operation with a higher speed when the MLC memory block is used as the SLC memory block. Thus, the controller 130 may use the MLC memory block as an SLC buffer to temporarily store data because the buffer may require a high data input/output speed for improving performance of the memory system 110.

According to an embodiment, the controller 130 can program data in an MLC a plurality of times without performing an erase operation on a specific MLC memory block included in the memory device 150. In general, non-volatile memory cells do not support data overwrite. However, the controller 130 may program 1-bit data in the MLC a plurality of times using a feature in which the MLC is capable of storing multi-bit data. For an MLC overwrite operation, the controller 130 may store the number of program times as separate operation information when 1-bit data is programmed in an MLC. According to an embodiment, an operation for uniformly levelling threshold voltages of the MLCs may be carried out before another 1-bit data is programmed in the same MLCs, each having stored another-bit data.

In an embodiment, the memory device 150 is embodied as a non-volatile memory such as a flash memory, for example, as a NAND flash memory, a NOR flash memory, or the like. In another embodiment, the memory device 150 may be implemented by at least one of a phase change random access memory (PCRAM), a ferroelectrics random access memory (FRAM), a spin transfer torque random access memory (SU-RAM), and a spin transfer torque magnetic random access memory (STT-MRAM), or the like.

Figure 3:
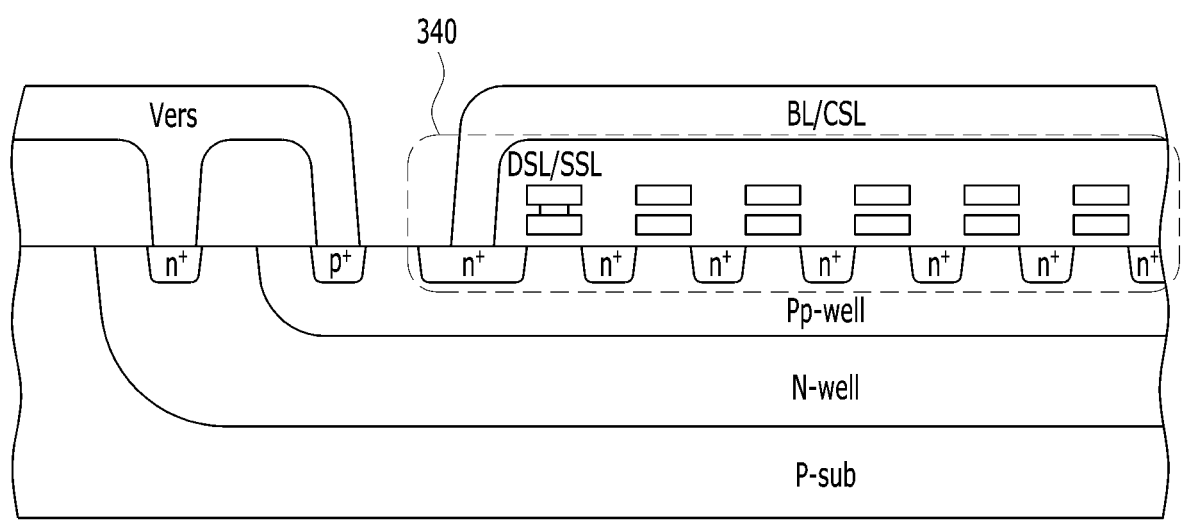
FIG. 3 illustrates a phenomenon in which charges are generated in a channel during an erase operation performed in a memory device according to an embodiment of the present disclosure.

FIG. 3 illustrates a phenomenon in which charges are generated in a channel during an erase operation performed in a memory device according to an embodiment of the present disclosure. Specifically, FIG. 3 describes a cross-section of the string 340 described in FIG. 1 as an example. A shape or a thickness of layers in the cross-section of the string 340 may vary according to a manufacturing process of the memory device 150 and characteristics of the (2D or 3D) structure of the string 340.

Referring to FIG. 3, a semiconductor substrate (P-sub) can be a P-type silicon semiconductor. A pocket P-type well region (Pp-well) may be formed at a preset depth from a surface of the semiconductor substrate (P-sub). The pocket P-type well region (Pp-well) can be surrounded by an N-type well region. In the pocket P-type well region (Pp-well), n+ doped regions doped with N-type impurities can be isolated with a channel region interposed therebetween. A control gate of a non-volatile memory cell can be formed between the n+ doped regions.

During an erase operation, an erase voltage Vers having a significantly higher level than that of a power voltage can be applied to the bulk (Pp-well) in which the plural non-volatile memory cells are disposed. When a high-level voltage is applied to the bulk, the high voltage might also be applied to a bit line BL or a common source line CSL by a PN junction forward bias. Also, the high-level voltage applied to the bulk may affect the n+ doped regions arranged between the control gates of the non-volatile memory cells. For example, the erase voltage Vers can have a higher level than 15V, while the power voltage has a lesser level than 3V~5V. Transistors coupled between the plural non-volatile memory cells and the bit line BL or the common source line CSL might be a type of high-voltage transistors which are endurable and operatable under a circumstance of applying a high-level voltage. In addition, the high-level voltage should not be directly applied to a low voltage circuit such as a page buffer or a bit line driver operating under a circumstance using a low-level power supply voltage.

Referring to FIGS. 1 and 3, due to a structure of the memory device 150, when an erase voltage Vers having a high level is applied to the bulk (Pp-well) during an erase operation, charges could be accumulated in the channel of the string 340. Because the charges accumulated in the channel of the string 340 may interfere with the erase operation, the memory device 150 can apply a ground voltage to the bit line BL and the common source line CSL to discharge the charges accumulated in the channel through the bit line BL and the common source line CSL.

In FIG. 3, it has been described that the erase voltage Vers is applied to the bulk (Pp-well) as an example. However, according to an embodiment, the erase voltage Vers can be applied to the bit line BL and the common source line CSL to erase data stored in the plurality of non-volatile memory cells.

Figure 4:
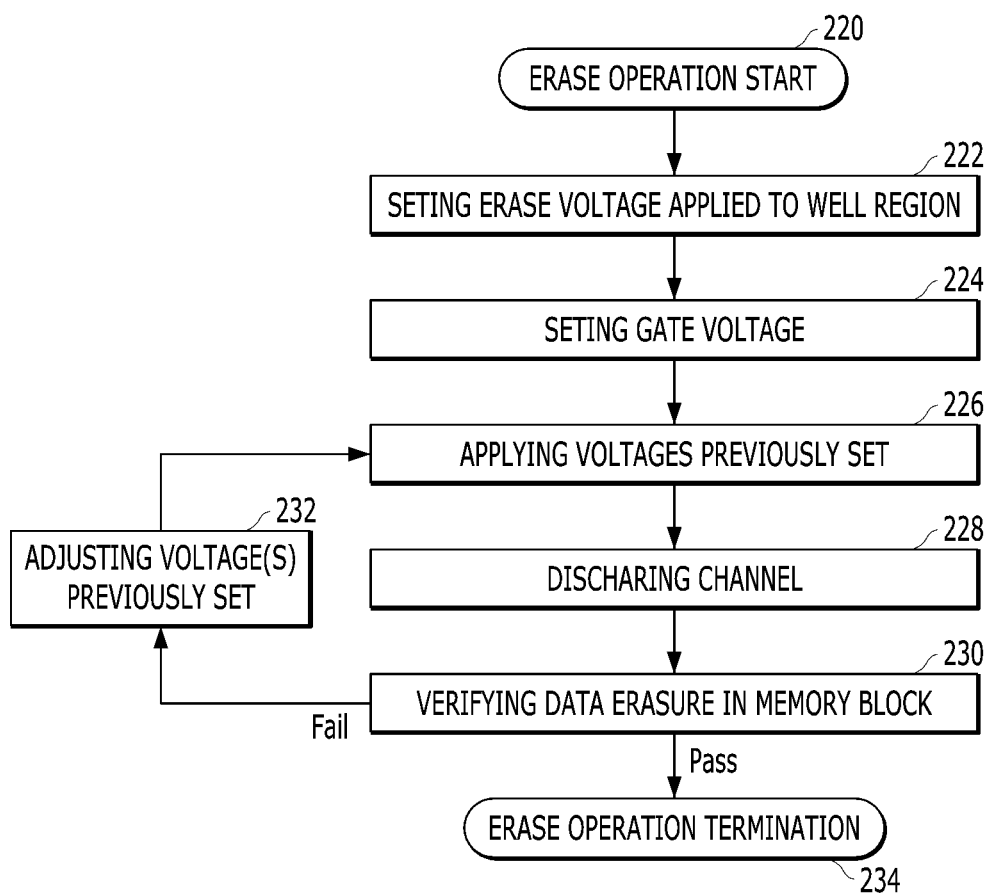
FIG. 4 illustrates a method for erasing data stored in a non-volatile memory cell according to an embodiment of the present disclosure.

FIG. 4 illustrates a method for erasing data stored in a non-volatile memory cell according to an embodiment of the present disclosure.

Referring to FIG. 4, when the controller 130 described in FIG. 2 transmits an erase command to the memory device 150, the memory device 150 can start an erase operation (operation 220). According to an embodiment, the controller 130 can transmit an address indicating at least one memory block to the memory device 150 along with the erase command. The memory device 150 can determine a range in which an erase operation is to be performed based on the address transmitted from the controller 130.

The memory device 150 can set a level of an erase voltage Vers to be applied to a well region corresponding to the memory block for the erase operation (operation 222). According to an embodiment, the level of the erase voltage Vers can be determined based on operating characteristics of non-volatile memory cells. Further, the level of the erase voltage Vers can be adjusted according to an operating condition (e.g., a temperature, etc.) or an operating state (e.g., a wear level) of the memory device 150.

The memory device 150 may establish a gate voltage applied to each string in the memory block for the erase operation (operation 224). In this case, the gate voltage may include a voltage applied to a word line connected to the non-volatile memory cells and a voltage applied through a drain select line DSL and a source select line SSL. Also, the gate voltage can include a control signal for determining whether a ground voltage is applied to the common source line CSL and the bit line BL.

When levels of the erase voltage Vers and the gate voltage for the erase operation are determined, the determined voltage levels can be applied to a memory block (operation 226). When the erase voltage Vers is applied to a well region in which the memory block is located and the gate voltage is applied through word lines coupled to the memory block, data stored in non-volatile memory cells in the memory block can be erased.

Referring to FIGS. 1 and 3 to 4, when the memory device 150 applies the erase voltage Vers to the well region in which the memory block is located, charges are accumulated in the channel of the string 340. The memory device 150 can discharge the charges in the channel of the string 340 (operation 228). According to an embodiment, in order to control a speed or a time for discharging the charges in the channel of the string 340, the memory device 150 can control a transistor configured to apply a ground voltage to the bit line BL or the common source line CSL. For example, the memory device 150 can either adjust a level of the gate voltage applied to a gate of the transistor applying the ground voltage to the bit line BL or the common source line CSL or adjust the number of turned-on transistors applying the ground voltage to the bit line BL or the common source line CSL. The memory device 150 can control or change a path through which charges are discharged to the channel of the string 340, to synchronize speeds or times of discharging the charges accumulated in the channel which are discharged through the bit line BL and the common source line CSL.

The memory device 150 can verify whether data stored in the memory block is erased (operation 230). When the data is erased from the memory block (pass of the operation 230), the memory device 150 can terminate the erase operation (operation 234). On the other hand, when all data in the memory block is not erased (failure of the operation 230), the memory device 150 can adjust or change levels of a voltage established for the erase operation (operation 232). For example, when data is not erased, a level of the erase voltage Vers can be increased for the erase operation. Also, according to an embodiment, the memory device 150 can determine that a gate voltage is not applied to a word line coupled to non-volatile memory cells in which data is not erased. When voltages applied for the erase operation are adjusted or changed (operation 232), the memory device 150 may apply a voltage having an adjusted level to the memory block (operation 226).

Figure 5:
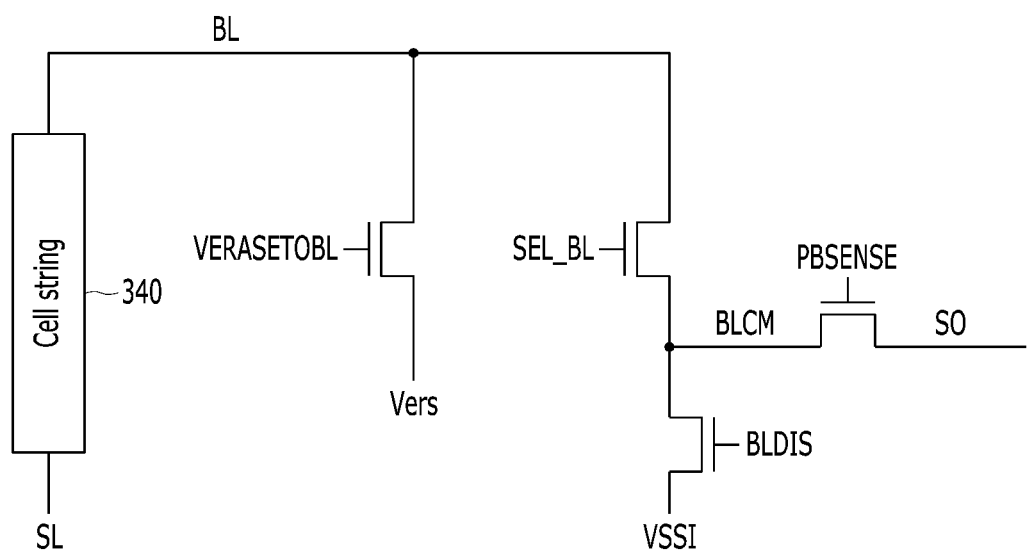
FIG. 5 illustrates a circuit for controlling a bit line of a memory device according to an embodiment of the present disclosure.

FIG. 5 illustrates a circuit for controlling a bit line of a memory device according to an embodiment of the present disclosure.

Referring to FIG. 5, a string 340 can be coupled to a source line SL and a bit line BL. Herein, the source line SL can correspond to the common source line CSL described with reference to FIG. 1.

The bit line BL can be coupled to the page buffers 322, 324, 326 (refer to FIG. 1) by a page buffer control signal PBSENSE. During a read operation or a verify operation, sensed data SO may be output through the bit line BL.

The bit line BL can be controlled by a bit line selection signal SEL_BL. For example, the bit line selection signal SEL_BL can output data transmitted through the bit line BL during a read operation or apply a ground voltage VSSI to the bit line BL during an erase operation.

In an embodiment, the erase voltage Vers can be applied to the bit line BL based on an erase voltage application signal VERASETOBL. Because the erasing voltage Vers has a high voltage level, the erasing voltage applying signal VERASETOBL can be applied to a transistor designed to avoid occurring an operation problem even when a high-level voltage is applied.

For example, the erase voltage Vers can be applied to the bit line BL and the bit line selection signal SEL_BL can be a logic low level (L), when the erase voltage application signal VERASETOBL becomes a logic high level (H) during the erase operation. When a time or an operation interval for erasing data from the non-volatile memory cells elapses, the erase voltage application signal VERASETOBL can become the logic low level (L). In addition, in order to discharge the charges accumulated in the channel of the string 340, the bit line selection signal SEL_BL and the bit line discharge signal BLDIS can be the logic high level (H). Through these methods, the charges accumulated in the channel of the string 340 can be discharged, so that a potential of the channel becomes 0V.

During the erase operation, a ground voltage VSSI can be applied to the bit line BL to discharge the charges accumulated in the channel of the string 340. When the bit line discharge signal BLDIS is activated, the ground voltage VSSI can be applied to the bit line BL. By adjusting a voltage level of the bit line discharge signal BLDIS, a speed or a time of discharging the charges accumulated in the channel of the string 340 through the bit line BL may be adjusted or changed.

Figure 6:
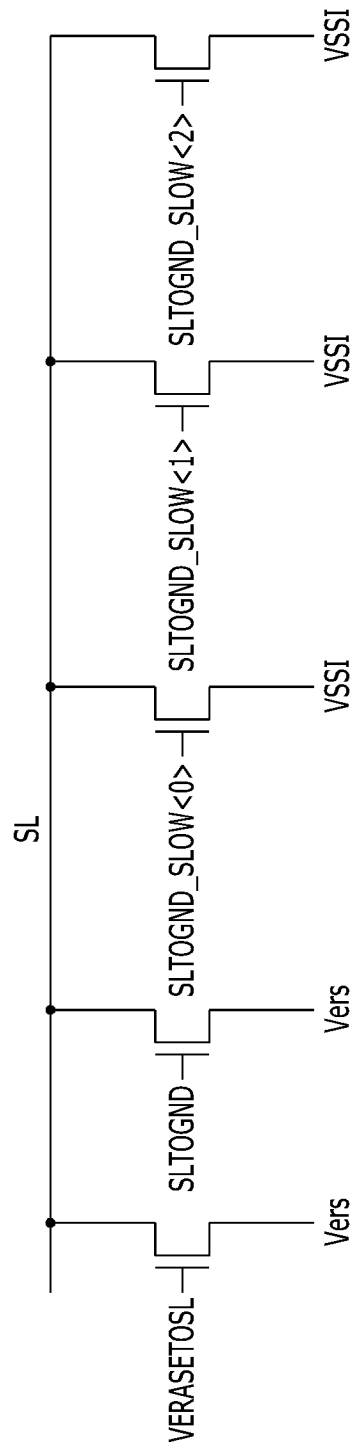
FIG. 6 illustrates a circuit for controlling a common source line of a memory device according to an embodiment of the present disclosure.

FIG. 6 illustrates a circuit for controlling a common source line of a memory device according to an embodiment of the present disclosure.

Referring to FIG. 6, a plurality of transistors are coupled in parallel to the source line SL. The source line SL can correspond to the common source line CSL described with reference to FIG. 1. During the erase operation, the erase voltage Vers can be applied to the source line SL in response to an erase voltage application signal VERASETOSL. The erasing voltage applying signal VERASETOSL described in FIG. 6 and the erasing voltage applying signal VERASETOBL described in FIG. 5, which might be applied to different locations, can be simultaneously activated, or deactivated. Because the erasing voltage Vers has a high level, the erasing voltage applying signal VERASETOSL can be applied to a transistor designed to avoid occurring an operation problem even when a high-level voltage is applied.

For example, when the erase voltage application signal VERASETOSL becomes the logic high level (H) during the erase operation, the erase voltage Vers can be applied to the source line SL. When a time or an operation interval for erasing data from the non-volatile memory cells elapses, the erase voltage application signal VERASETOSL can become the logic low level (L). In addition, in order to discharge the charges accumulated in the channel of the string 340, source line discharge signals SLTOGND, SLTOGND_SLOW<0:2> can have a logic high level (H). Through this method, the charges accumulated in the channel of the string 340 can be discharged, so that a potential of the channel becomes 0V.

According to an embodiment, all of the source line discharge signals SLTOGND, SLTOGND_SLOW<0:2> can be activated in order to rapidly discharge the charges accumulated in the channel of the string 340. Furthermore, a part of the source line discharge signals SLTOGND, SLTOGND_SLOW<0:2> can be activated to slowly discharge the charges accumulated in the channel of the string 340. The number of transistors turned on to apply the ground voltage VSSI to the channel can vary based on how many the source line discharge signals SLTOGND, SLTOGND_SLOW<0:2> are activated. Through this method, a speed or a time of discharging the charges accumulated in the channel of the string 340 through the source line SL can be adjusted or changed.

Referring to FIGS. 5 and 6, because a component (e.g., a page buffer, etc.) coupled to the bit line BL is included in the memory device 150, it might be difficult to increase the number of transistors coupled to the bit line BL to discharge the charges accumulated in the channel of the string 340 through the bit line BL. However, a configuration of increasing the number of transistors of applying a ground voltage to the source line SL could be more simply embodied than a configuration of increasing the number of transistors of applying the ground voltage to the bit line BL.

Referring to FIG. 1, a plurality of non-volatile memory cells is coupled a page buffer through a single bit line BL. On the other hand, the source line SL can be coupled to a plurality of strings 340 like the common source line CSL. Due to this structural difference, parasitic capacitance present in the bit line BL and the common source line CSL can be different. For example, the parasitic capacitance of the common source line CSL might be greater than the parasitic capacitance of the bit line BL. For this reason, a rate or a time of discharge the charges accumulated in the channel of the string 340 through the common source line CSL and the bit line BL can be different.

Figure 7:
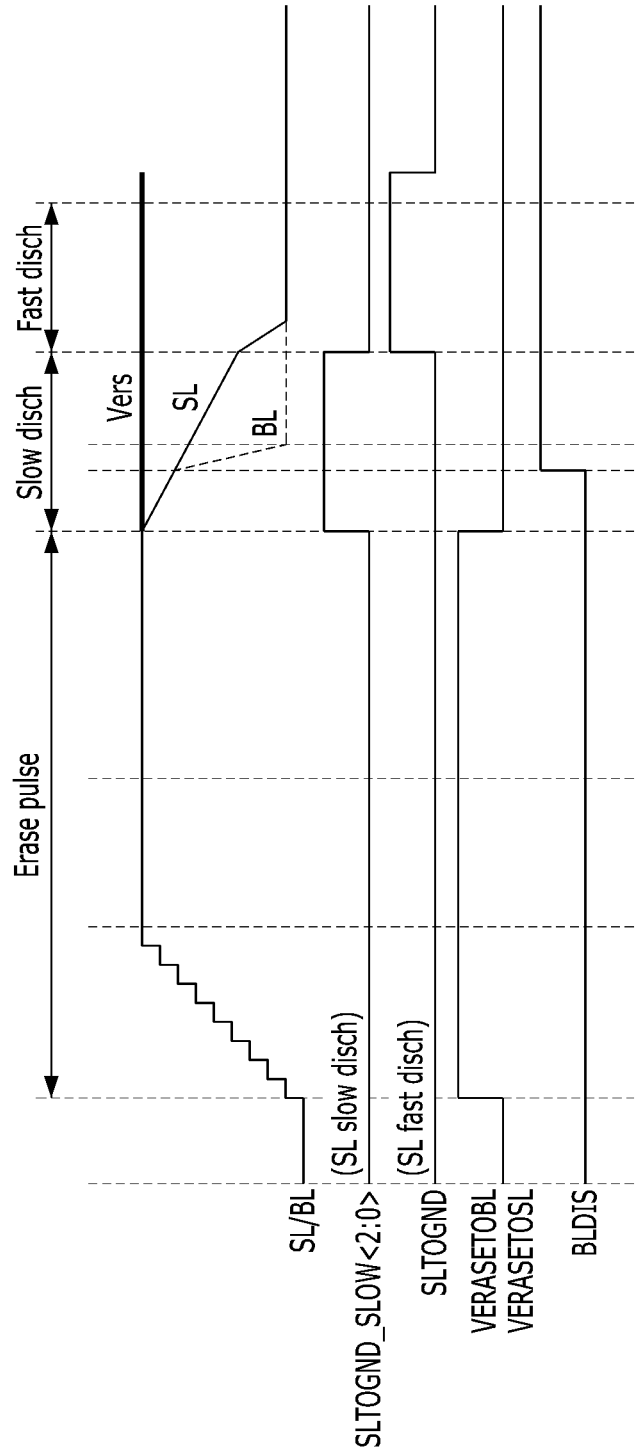
FIG. 7 illustrates channel discharge during an erase operation performed in a memory device according to an embodiment of the present disclosure.

FIG. 7 illustrates channel discharge during an erase operation performed in a memory device according to an embodiment of the present disclosure.

Referring to FIG. 7, the memory device 150 can use erase voltage application signals VERASETOBL, VERASETOSL for applying the erase voltage Vers to the bit line BL and the source line SL coupled to the string 340 during the erase operation. When the erase voltage application signals VERASETOBL, VERASETOSL are applied, potentials of the bit line BL and the source line SL could continue to rise.

After a time or an operation interval for erasing data from the plural non-volatile memory cells elapses, the erase voltage application signals VERASETOBL, VERASETOSL are deactivated, and the charges accumulated in the channel of the string 340 can be discharged through the bit line BL and the source line SL.

Referring to FIG. 7, the charges accumulated in the channel in the string 340 are discharged at different rates through the bit line BL and the source line SL, so that slopes of decreasing potentials of the bit line BL and the source line SL to 0V are different. As described above, when the bit line discharge signal BLDIS is activated, the charges are fast discharged through the bit line BL. But, based on whether the source line discharge signals SLTOGND, SLTOGND_SLOW<0:2> are activated, a rate of discharging the charges through the source line SL can be controlled differently.

According to an embodiment, in order to synchronize the rate or time of discharging the charges accumulated in the channel in the string 340 through the bit line BL and the source line SL, the memory device 150 can use the source line discharge signals SLTOGND, SLTOGND_SLOW<0:2> to increase the rate of discharging the charges through the source line SL, or use the bit line discharge signal BLDIS to decrease the rate of discharging the charges through the bit line BL.

Figure 8:
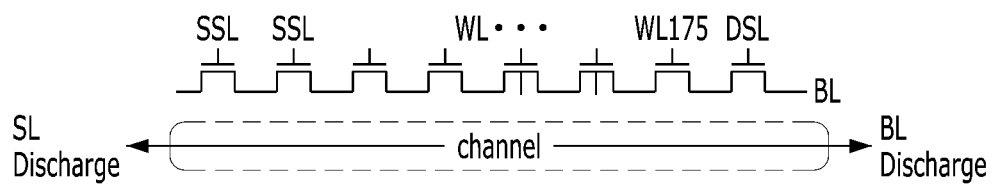
FIG. 8 illustrates a discharge operation of charges in a channel of a string through a bit line and a common source line during an erase operation performed in a memory device according to an embodiment of the present disclosure.

FIG. 8 illustrates a discharge operation of charges in a channel of a string through a bit line and a common source line during an erase operation performed in a memory device according to an embodiment of the present disclosure.

Referring to FIG. 8, charges accumulated in the channel of the string 340 can be discharged through the bit line BL and the source line SL. While the charges accumulated in the channel are discharged after an erase voltage Vers or an erase pulse is applied to the string 340, a coupling capacitance can be formed between the channel and a word line. The coupling capacitance formed between the channel and the word line can induce negative boosting or under coupling in which the word line WL is negatively down-coupled. In this case, a phenomenon in which characteristics of non-volatile memory cells are changed depending on locations of the non-volatile memory cell in the string 340 can occur. When the characteristics of the non-volatile memory cells are different, operation reliability of the memory device 150 can be deteriorated. To avoid this issue, the memory device 150 may slow speeds of the discharge through the bit line BL and the source line SL. However, when the speeds are slowed, performance of the erase operation may deteriorate.

In an embodiment of the present disclosure, when the charges in the channel of the string are discharged through the bit line and the common source line, a first discharge rate of the charges through the bit line can be changed or adjusted in response to a second discharge rate of the charges through the source line, so that the first and second discharge rates (or two discharge times) could be synchronized.

Figure 9:
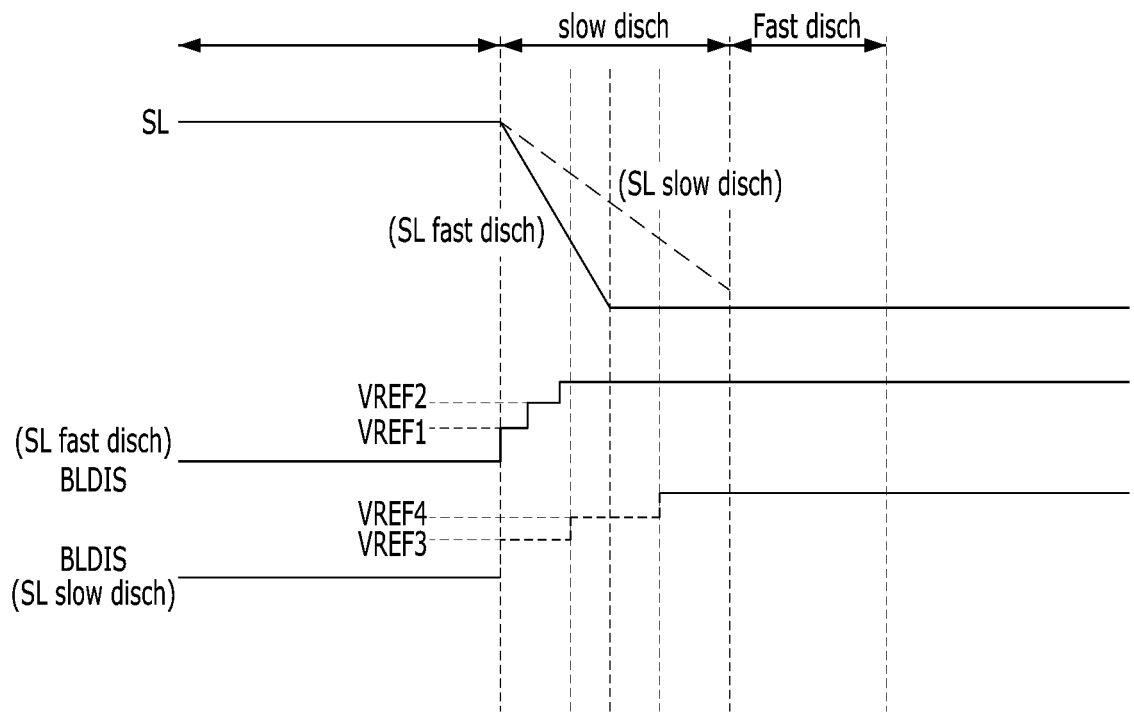
FIG. 9 illustrates a method for synchronizing discharge through a bit line and a common source line in a memory device according to an embodiment of the present disclosure.

FIG. 9 illustrates a method for synchronizing discharge through a bit line and a common source line in a memory device according to an embodiment of the present disclosure.

Referring to FIG. 9, a speed of discharging the charges through the source line SL can be increased (SL fast disch) or decreased (SL slow disch). For example, as described in FIG. 6, based on the number of activated signals among the source line discharge signals SLTOGND, SLTOGND_SLOW<0:2>, the speed of discharging the charges in the channel of the string 340 through the source line SL can be adjusted or changed. In response to the speed of discharging the charges through the source line SL, the memory device 150 applies the bit line discharge signal BLDIS having one of various levels VREF1, VREF2, VREF3, VREF4 during different periods. Through this method, a speed of discharging the charges in the channel of the string 340 through the bit line BL can be adjusted or changed.

In order to synchronize the speeds or times of discharging the charges accumulated in the channel in the string 340 through the bit line BL and the source line SL, the memory device 150 can store control information in a register. The control information for controlling the speed of discharging the charges through the source line SL can include how many and how long the source line discharge signals SLTOGND, SLTOGND_SLOW<0:2> are activated. Based on the control information, the memory device 150 can adjust or change a level of the bit line discharge signal BLDIS to control the speed of discharging the charges through the bit line BL. Referring to FIG. 9, when it might be estimated that the speed of discharging the charges through the source line SL is fast (SL fast disch), the memory device 150 can apply first and second levels VREF1, VREF2 to rapidly increase a level of the bit line discharge signal BLDIS. When it might be estimated that the speed of discharging the charges through the source line SL is slow (SL slow disch), the memory device 150 can apply third and fourth levels VREF3, VREF4 to slowly increase the level of the bit line discharge signal BLDIS. Depending on the voltage levels VREF1, VREF2, VREF3, VREF4 applied to the bit line discharge signal BLDIS, the speed (or time) of discharging the charges through the bit line BL may be increased or decreased (short or long).

Figure 10:
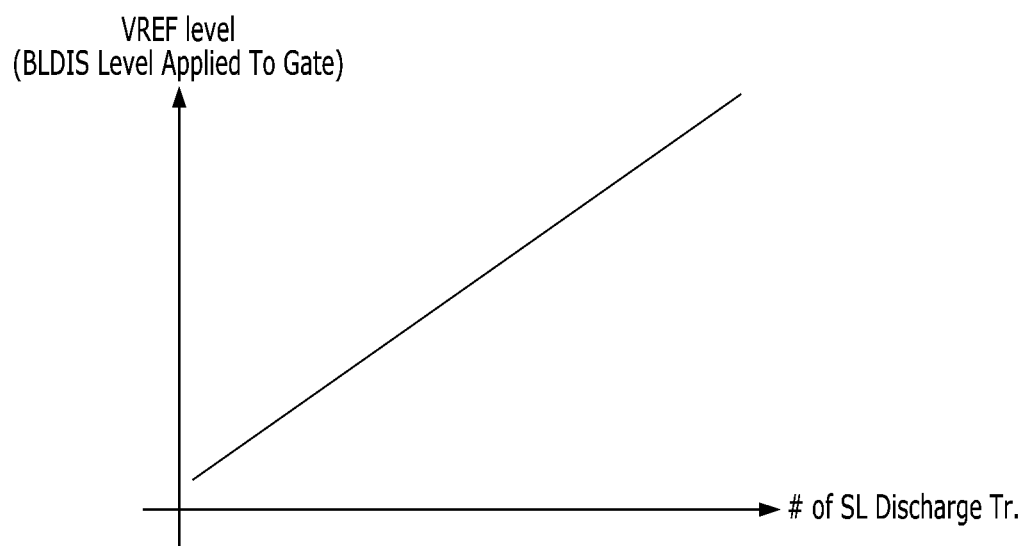
FIG. 10 illustrates a first example for synchronizing discharge according to an embodiment of the present disclosure.
Figure 11:
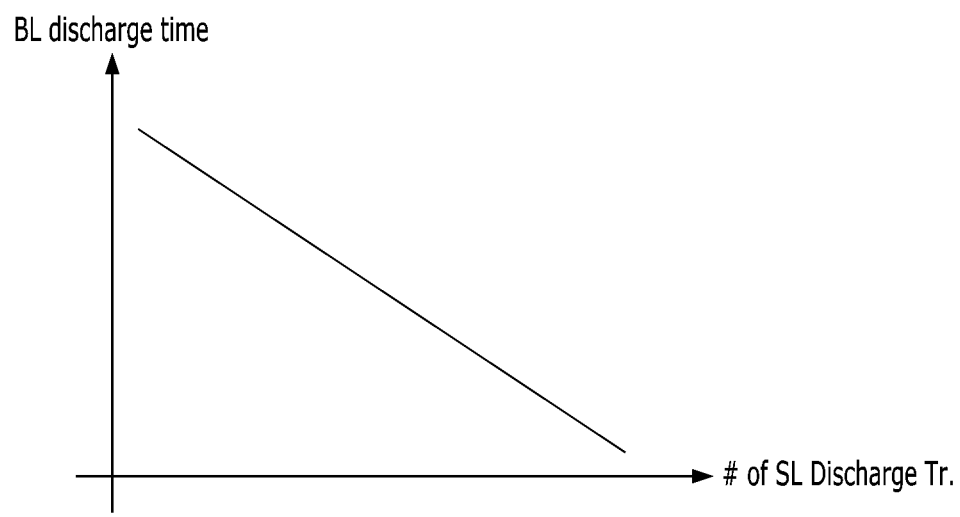
FIG. 11 illustrates a second example for synchronizing discharge according to an embodiment of the present disclosure.
Figure 12:
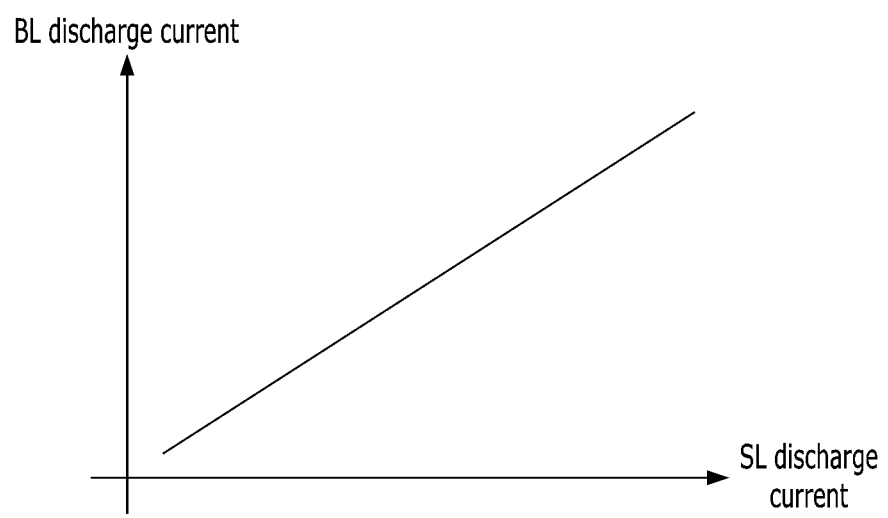
FIG. 12 illustrates a third example for synchronizing discharge according to an embodiment of the present disclosure.

Referring to FIGS. 10 to 12, an embodiment for synchronizing a discharge rate or time of charges accumulated in the channel of the string 340 through the bit line BL and the source line SL would be described hereinafter.

FIG. 10 illustrates a first example for synchronizing discharge according to an embodiment of the present disclosure.

Referring to FIG. 10, in order to synchronize the speeds or times of discharging the charges accumulated in the channel of the string 340 through the bit line BL and the source line SL, the memory device 150 can increase a voltage level of the bit line discharge signal BLDIS as the number of transistors activated for discharging the charges through the source line SL increases. Here, the number of activated transistors can correspond to the number of activated signals among the source line discharge signals SLTOGND, SLTOGND_SLOW<0:2>.

As described with reference to FIG. 9, the memory device 150 can recognize the number of activated signals among the source line discharge signals SLTOGND, SLTOGND_SLOW<0:2> through a value stored in a register, and then control or adjust a level of the bit line discharge signal BLDIS based on recognized number.

FIG. 11 illustrates a second example for synchronizing discharge according to an embodiment of the present disclosure.

Referring to FIG. 11, in order to synchronize the speeds or times of discharging the charges accumulated in the channel of the string 340 through the bit line BL and the source line SL, the memory device 150 can reduce a time of discharging the charges through the bit line BL as the number of transistors activated for discharging the charges through the source line SL increases. For example, the memory device 150 can increase a voltage level (VREF level) of the bit line discharge signal BLDIS to decrease a time of discharging the charges through the bit line BL.

FIG. 12 illustrates a third example for synchronizing discharge according to an embodiment of the present disclosure.

Referring to FIG. 12, the memory device 150 can synchronize the speeds or times of discharging the charges accumulated in the channel of the string 340 through the through the bit line BL and the source line SL based on discharge currents generated in the source line SL and the bit line BL. Unlike the embodiment described with reference to FIG. 10 in which the voltage level of the bit line discharge signal BLDIS is adjusted and changed, the memory device 150 according to the embodiment described with reference to FIG. 12 can generate a control current or a reference current (Current Ref) and apply the control current or the reference current (Current Ref) to a transistor for discharging the charges through the source line SL and a transistor for discharging the charges through the bit line BL. When an amount of the control current or reference current (Current Ref) applied by the memory device 150 increases, a discharge speed can increase. When the amount of the control current or the reference current (Current Ref) decreases, the discharge speed can decrease. In the memory device 150, the control current or reference current (Current Ref) applied to the transistor for discharging the charge through the source line SL can be different from that applied the transistor for discharging the charge through the bit line BL. Even if those currents are not the same, those currents might have similar tendency, e.g., both currents can be either increased or decreased together. That is, the memory device 150 can determine changes of the control currents or the reference currents (Current Ref) in a same direction of decrement or increment.

Referring to FIGS. 10 to 12, according to an embodiment, in order to synchronize the speeds or times of discharging the charges accumulated in the channel of the string 340 through the bit line BL and the source line SL, the memory device 150 can adjust or change a voltage level, a current amount, and/or a discharge time.

As described above, while the memory device performs an erase operation, the memory device according to an embodiment of the present disclosure may discharge electric charges which have occurred in the channel of the string, at a same rate through the bit line and the common source line, so that data can be more effectively erased during the erase operation regardless of locations of the non-volatile memory cells.

In addition, the memory device according to an embodiment of the present disclosure can reduce a difference of characteristics that may occur depending on a location of the non-volatile memory cell during an erase operation for erasing data stored in the non-volatile memory cell, thereby improving operation reliability of the non-volatile memory cell.

The methods, processes, and/or operations described herein may be performed by code or instructions to be executed by a computer, processor, controller, or other signal processing device. The computer, processor, controller, or other signal processing device may be those described herein or one in addition to the elements described herein. Because the algorithms that form the basis of the methods (or operations of the computer, processor, controller, or other signal processing device) are described in detail, the code or instructions for implementing the operations of the method embodiments may transform the computer, processor, controller, or other signal processing device into a special-purpose processor for performing the methods herein.

Also, another embodiment may include a computer-readable medium, e.g., a non-transitory computer-readable medium, for storing the code or instructions described above. The computer-readable medium may be a volatile or non-volatile memory or other storage device, which may be removably or fixedly coupled to the computer, processor, controller, or other signal processing device which is to execute the code or instructions for performing the method embodiments or operations of the apparatus embodiments herein.

The controllers, processors, control circuitry, devices, modules, units, multiplexers, generators, logic, interfaces, decoders, drivers, generators and other signal generating and signal processing features of the embodiments disclosed herein may be implemented, for example, in non-transitory logic that may include hardware, software, or both. When implemented at least partially in hardware, the controllers, processors, control circuitry, devices, modules, units, multiplexers, generators, logic, interfaces, decoders, drivers, generators and other signal generating and signal processing features may be, for example, any one of a variety of integrated circuits including but not limited to an application-specific integrated circuit, a field-programmable gate array, a combination of logic gates, a system-on-chip, a microprocessor, or another type of processing or control circuit.

When implemented at least partially in software, the controllers, processors, control circuitry, devices, modules, units, multiplexers, generators, logic, interfaces, decoders, drivers, generators and other signal generating and signal processing features may include, for example, a memory or other storage device for storing code or instructions to be executed, for example, by a computer, processor, microprocessor, controller, or other signal processing device. The computer, processor, microprocessor, controller, or other signal processing device may be those described herein or one in addition to the elements described herein.

While the present teachings have been illustrated and described with respect to the specific embodiments, it will be apparent to those skilled in the art in light of the present disclosure that various changes and modifications may be made without departing from the spirit and scope of the disclosure as defined in the following claims. Furthermore, the embodiments may be combined to form additional embodiments.

What is claimed is:

1. A memory device, comprising:
a cell string including plural non-volatile memory cells which are capable of storing data, the cell string arranged between a bit line and a source line;
plural first discharge transistors coupled in parallel to the source line for providing a first current path of discharging the charges;
at least one second discharge transistor coupled to the bit line for providing a second current path of discharging charges which are accumulated in a channel formed through the cell string; and
a control circuit configured to control the plural first discharge transistors and the at least one second discharge transistor for synchronizing discharge of the charges via the first and second current paths, the bit line, and the source line during an erase operation for erasing the data stored in the plural non-volatile memory cells.

2. The memory device according to claim 1, wherein the control circuit is configured to control a level of voltage applied to the plural first discharge transistors or the at least one second discharge transistor to synchronize the discharge of charges in the channel through the bit line and the source line at a same speed or within a preset time difference.

3. The memory device according to claim 1, wherein the control circuit is configured to adjust a second speed of the discharge of charges through the bit line in response to a first speed of the discharge of charges through the source line to synchronize the discharge of charges in the channel through the bit line and the source line.

4. The memory device according to claim 3, wherein the control circuit is configured to change a level of voltage applied to a gate of the at least one second discharge transistor configured to apply a ground voltage to the bit line to adjust the second speed.

5. The memory device according to claim 4, wherein the control circuit changes the level of voltage applied to the gate of the second discharge transistor to change a resistance of the second discharge transistor.

6. The memory device according to claim 1,
wherein the plural first discharge transistors are individually configured to apply a ground voltage to the source line,
wherein the control circuit is configured to selectively turn on the plural first discharge transistors to control a first speed of the discharge of charges through the source line to synchronize the discharge of charges in the channel through the bit line and the source line.

7. The memory device according to claim 6,
wherein the at least one second discharge transistor is configured to apply the ground voltage to the bit line,
wherein the control circuit is configured to change a level of voltage applied to a gate of a second discharge transistor in response to turn-on of the plural first discharge transistors to synchronize the discharge of charges in the channel through the bit line and the source line.

8. The memory device according to claim 1, wherein the control circuit is configured to turn on a greater number of the plural first discharge transistors than a number of the at least one second discharge transistors.

9. The memory device according to claim 1,
wherein the control circuit is configured to adjust levels of a first voltage and a second voltage applied to gates of the plural first discharge transistors and the at least one second discharge transistor to control a first speed of the discharge of charges through the source line and a second speed of the discharge of charges through the bit line to synchronize the discharge of charges in the channel through the bit line and the source line.

10. The memory device according to claim 9, wherein the first voltage and the second voltage are applied simultaneously, and the first voltage has a higher level than the second voltage.

11. A memory system comprising:
a memory device configured to store data; and
a controller coupled to the memory device and configured to transmit an erase command regarding the data,
wherein the memory device comprises:
a cell string including plural non-volatile memory cells arranged in series between a bit line and a source line
plural first discharge transistors coupled in parallel to the source line for providing a first current path of discharging the charges;
at least one second discharge transistor coupled to the bit line for providing a second current path of discharging charges which are accumulated in a channel formed through the cell string; and
a control circuit configured to control the plural first discharge transistors and the at least one second discharge transistor for synchronizing discharge of the charges via the first and second current path, the bit line and the source line in response to the erase command.

12. The memory system according to claim 11, wherein the control circuit is configured to control a level of voltage applied to the plural first discharge transistors or the at least one second discharge transistor to synchronize the discharge of charges in the channel through the bit line and the source line at a same speed or within a preset time difference.

13. The memory system according to claim 11, wherein the control circuit is configured to adjust a second speed of the discharge of charges through the bit line in response to a first speed of the discharge of charges through the source line to synchronize the discharge of charges in the channel through the bit line and the source line.

14. The memory system according to claim 13, wherein the control circuit is configured to change a level of voltage applied to a gate of the at least one second discharge transistor configured to apply a ground voltage to the bit line to adjust the second speed.

15. The memory system according to claim 11,
wherein the plural first discharge transistors are individually configured to apply a ground voltage to the source line, and
wherein the control circuit is configured to selectively turn on the plural first discharge transistors to control a first speed of the discharge of charges through the source line to synchronize the discharge of charges in the channel through the bit line and the source line.

16. The memory system according to claim 15,
wherein the at least one second discharge transistor is configured to apply the ground voltage to the bit line, and
wherein the control circuit is configured to change a level of voltage applied to a gate of a second discharge transistor in response to turn-on of the plural first discharge transistors to synchronize the discharge of charges in the channel through the bit line and the source line.

17. The memory system according to claim 11,
wherein the control circuit is configured to adjust levels of first and second voltages applied to gates of the plural first discharge transistors and the at least one second discharge transistors to control a first speed of the discharge of charges through the source line and a second speed of the discharge of charges through the bit line to synchronize the discharge of charges in the channel through the bit line and the source line, and
wherein the first and second voltages are applied simultaneously, and the first voltage has a higher level than the second voltage.

18. A method for operating a memory system, the method comprising:
determining levels of an erase voltage and a gate voltage for erasing data stored in plural non-volatile memory cells, arranged in series between a bit line and a source line, in response to an erase command;
applying an erase voltage to a bulk in which the plural non-volatile memory cells are located and applying a negative voltage or a ground voltage of 0V to a word line coupled to the plural non-volatile memory cells;
controlling plural first discharge transistors, coupled in parallel to the source line for providing a first current path, and at least one second discharge transistor, coupled to the bit line for providing a second current path, for controlling the first and second current paths for discharging charges accumulated in a channel formed by the plural non-volatile memory cells through the bit line and the source line to synchronize a discharge rate or time through the bit line and the source line; and
verifying whether the data is erased.

* * * * *